United States Patent [19]

Jefferson

[11] Patent Number: 5,699,020
[45] Date of Patent: Dec. 16, 1997

[54] PHASE LATCHED DIFFERENTIAL CHARGE PUMP CIRCUIT AND METHOD

[75] Inventor: David Edward Jefferson, San Jose, Calif.

[73] Assignee: Altera Corporation, San Jose, Calif.

[21] Appl. No.: 668,577

[22] Filed: Jun. 20, 1996

Related U.S. Application Data

[60] Provisional application No. 60/015,268 Apr. 11, 1996.
[51] Int. Cl.[6] .................... H03L 7/095; H03L 7/12
[52] U.S. Cl. .................. 331/17; 331/1 A; 331/14; 331/25; 331/DIG. 2; 327/157
[58] Field of Search .................. 331/1 A, 14, 17, 331/18, 25, DIG. 2; 327/105, 107, 156–159

[56] References Cited

U.S. PATENT DOCUMENTS

| | | | |
|---|---|---|---|
| 4,871,930 | 10/1989 | Wong et al. | 307/465 |
| 5,128,632 | 7/1992 | Erhart et al. | 331/DIG. 2 X |
| 5,204,555 | 4/1993 | Graham et al. | 307/465 |
| 5,260,611 | 11/1993 | Cliff et al. | 307/465 |

OTHER PUBLICATIONS

U. Ko et al., "A 30-ps Jitter, 3.6-μs Locking, 3.3-Volt Digital PLL For CMOS Gate Arrays", IEEE 1993 Custom Integrated Circuits Conference, pp. 23.3.1–23.3.4.

A. Efendovich et al., "Multi-Frequency Zero-Jitter Delay-Locked Loop", IEEE 1993 Custom Integrated Circuits Conference, pp. 27.1.1–27.1.4.

A. Efendovich et al., "Multifrequency Zero-Jitter Delay-Locked Loop", IEEE Journal of Solid-State Circuits, vol. 29, No. 1, Jan. 1994, pp. 67–70.

A. Walzman, "A Delay Line Loop for Frequency Synthesis of De-Skewed Clock", IEEE International Solid-State Circuits Conference 1994, pp. 298–299.

*Primary Examiner*—David Mis
*Attorney, Agent, or Firm*—Fish & Neave; Robert R. Jackson

[57] ABSTRACT

A loop circuit such as a delay lock loop or a phase lock loop includes circuitry for changing the strength of the lock after lock has been achieved. Before lock is achieved, the strength of the charge pump circuitry that controls the charge in the low-pass filter in the loop may be relatively weak. After lock has been achieved, the strength of the charge pump circuit may be increased so that the circuit can maintain its locked condition in a noisy environment.

8 Claims, 5 Drawing Sheets

PHASE LATCHED DIFFERENTIAL CHARGE PUMP CIRCUIT AND METHOD

CROSS REFERENCE TO RELATED APPLICATION

This application claims the benefit of U.S. provisional application No. 60/015,268, filed Apr. 11, 1996.

BACKGROUND OF THE INVENTION

This invention relates to electronic circuits of the types known as delay lock loops and phase lock loops.

Delay lock loop and phase lock loop circuits may be used to produce a clock signal which has a particular time shift relative to a reference clock signal. Although the clock signal produced by the loop circuit can be delayed relative to the reference clock, a common need is for a clock signal that is advanced relative to the reference clock. Thus, for convenience herein, all signals produced by a loop circuit will be referred to as "advanced clock signals", whether the signal is advanced or delayed relative to the reference clock.

An illustrative situation in which there may be a need for an advanced clock signal occurs in relatively large integrated circuit ("IC") devices such as programmable logic arrays. The reference clock signal may be applied to one input pin of the IC for distribution throughout the device. By the time the reference clock signal reaches portions of the IC that are relatively remote from the input pin, the signal may be significantly delayed (due to signal transmission delay in the IC) relative to the reference clock signal adjacent to the input pin. This can make it difficult to maintain synchronization between the various portions of the IC, and it may necessitate operating the IC at a slower clock rate than would otherwise be possible.

In order to compensate for this problem, a delay lock loop circuit or a phase lock loop circuit may be included on the IC. (For convenience herein, both of these types of circuits are referred to generically as "loop circuits".) The loop circuit is typically located near the reference clock input pin. The loop circuit receives the reference clock signal and produces an advanced clock signal. The advanced clock signal is generally similar to the reference clock signal, except that it is advanced in time relative to the reference clock by an amount which is approximately equal to the time required for a clock signal to travel from portions of the IC that are relatively close to the reference clock input pin to more remote portions of the IC. The advanced clock signal is transmitted to the above-mentioned more remote portions of the IC in lieu of the original reference clock signal, while the reference clock signal continues to be used near the reference clock input pin. In this way all portions of the IC receive synchronized clock signals, which facilitates synchronized operation of the IC, even at very high clock speeds.

The typical loop circuit 10 (see FIG. 1) has a phase frequency detector ("PFD") 12 for comparing the relative phases and frequencies of the reference clock signal 11 and a clock signal 21 that the loop circuit feeds back to the PFD. If the phase of the feed-back clock signal is behind the phase of the reference clock signal, the PFD produces a first type of output signal 13a. If the phase of the feed-back clock signal is ahead of the phase of the reference clock signal, the PFD produces a second type of output signal 13b. The first and second output signals of the PFD may be applied to a charge pump circuit 14, which charges or discharges the charge-storing element of a low-pass filter 16, depending on whether the PFD is producing the first or second output signal. The output signal of the low-pass filter may be applied as a control signal to a variable delay circuit or voltage controlled oscillator ("VCO") 18. If a variable delay circuit is used, the loop circuit is typically called a delay lock loop. The signal applied to the variable delay circuit for delay may be the reference clock signal 11a. If a VCO is used, the loop circuit is typically called a phase lock loop. The output signal of the variable delay circuit or the VCO may be the advanced clock signal 19, i.e., the ultimately desired output of the loop circuit. This signal may also be applied to a fixed delay circuit 20, which simulates the clock signal transmission delay that the advanced clock signal is intended to compensate for. The output signal of the fixed delay circuit is the feed-back clock signal 21 applied to the PFD.

The loop circuit is typically arranged so that if the feed-back clock signal is behind or later in time than the reference clock signal, the delay of the variable delay circuit is lessened somewhat (or the frequency of the VCO is increased somewhat) until the phases of the signals applied to the PFD match one another. Conversely, if the feed-back clock signal is ahead of or earlier in time than the reference clock signal, the delay of the variable delay circuit is increased somewhat (or the frequency of the VCO is decreased somewhat) until the phases of the signals applied to the PFD match one another.

Particularly in the case of delay lock loop circuits, it will be noted that the amount of delay required from the variable delay circuit depends on the frequency of the reference clock signal. This is so because each feed-back clock signal transition that the PFD compares to a reference clock signal transition is derived from an earlier reference clock signal transition.

The usefulness of a loop circuit can be increased (thereby increasing the usefulness of the circuitry employing the loop circuit) by increasing the reference clock signal frequency range that the loop circuit can automatically adapt to. For example, it may be desirable to provide a loop circuit that can automatically adapt to reference clock signal frequencies in the range from about 30 to about 70 MHZ.

Once a loop circuit has found the correct amount of reference clock signal delay or the correct VCO frequency and phase shift to produce the desired advanced clock signal, the loop circuit should remain strongly "locked" in that condition, and should not be thrown off by occasional noise in the reference clock signal, power supplies, or other noise sources.

In view of the foregoing, it is an object of this invention to provide improved circuitry and methods for control and operation of loop circuits.

It is a more particular object of this invention to provide improved charge pump circuits and methods for use in loop circuits.

SUMMARY OF THE INVENTION

These and other objects of the invention are accomplished in accordance with the principles of the invention by providing circuitry which detects when the phase and possibly also the frequency of both the feedback clock signal and the reference clock signal are approximately equal and have been approximately equal for at least some other recently preceding reference clock signal cycles. While this condition exists, the phases of the feed-back clock signal and the reference clock signal are considered locked, and the strength of the charge pump circuit is increased. This may be done by enabling additional selective connections between (1) the power voltage source and the low-pass filter charge storing component, and (2) the charge storing component and the ground voltage source. Changing the charge pump circuit in this way increases the ability of the loop circuit to remain locked, even in a noisy environment.

Further features of the invention, its nature and various advantages will be more apparent from the accompanying drawings and the following detailed description of the preferred embodiments.

BRIEF DESCRIPTION OF THE DRAWINGS

FIG. 5b is similar to FIG. 5a but shows an alternative frequency response for the component mentioned in connection with FIG. 5a.

DETAILED DESCRIPTION OF THE PREFERRED EMBODIMENTS

Figure 1:
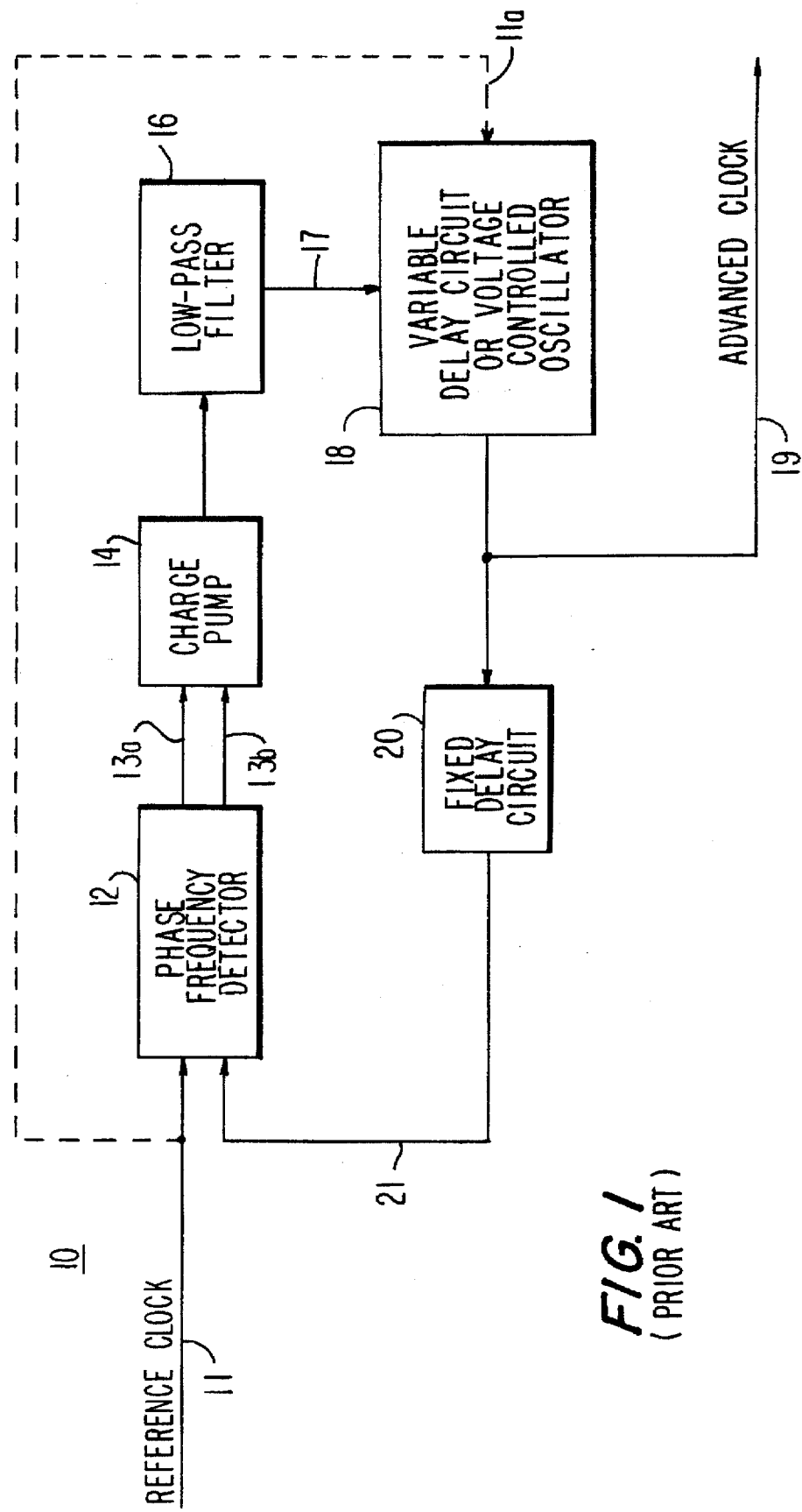
FIG. 1 is a simplified block diagram of a typical prior art delay lock loop or phase lock loop circuit.
Figure 2:
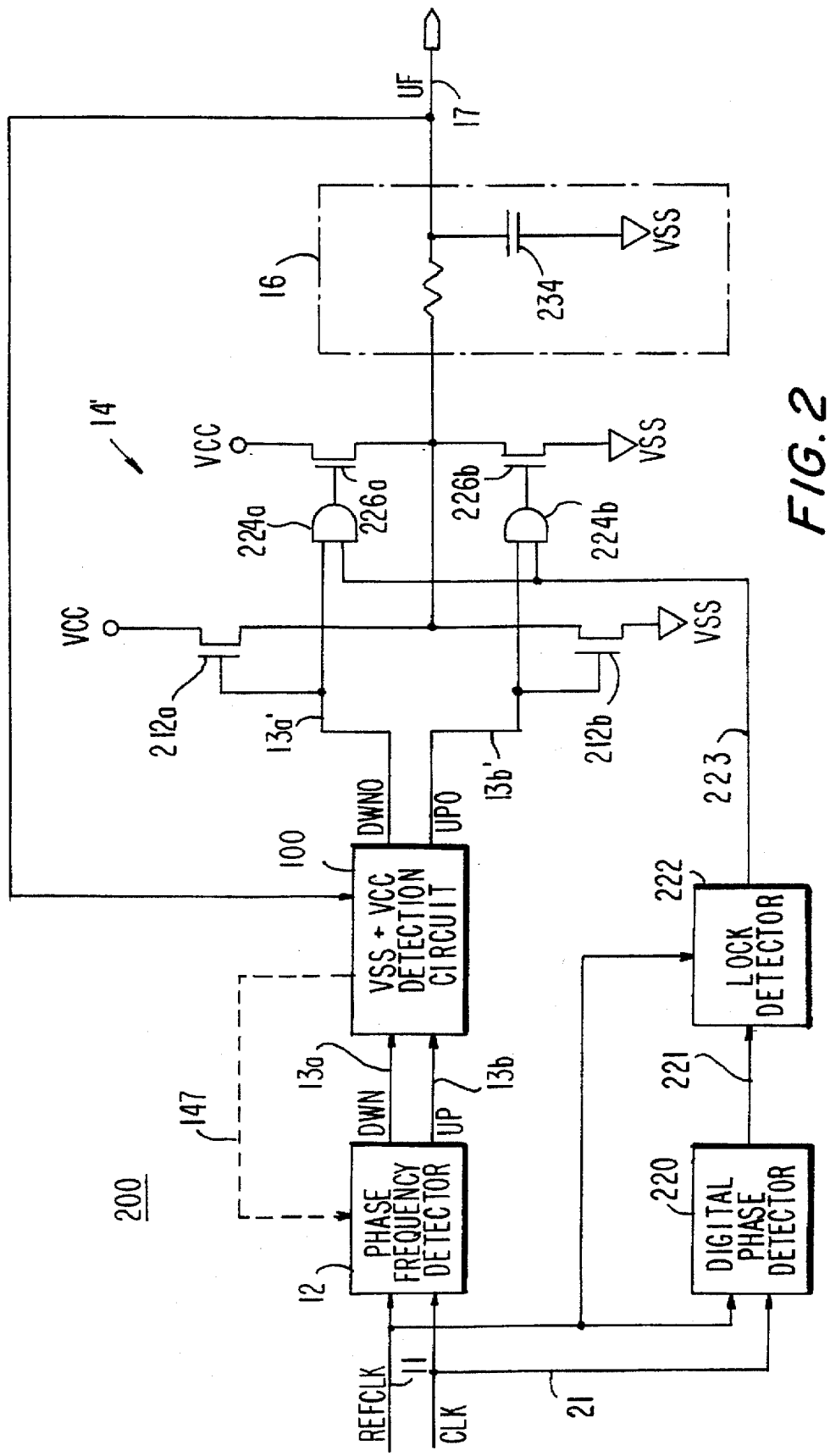
FIG. 2 is a simplified schematic block diagram of an illustrative embodiment of circuitry constructed in accordance with this invention which can be included in circuits of the type shown in FIG. 1.

The illustrative embodiment of the circuitry 200 of this invention which is shown in FIG. 2 may take the place of elements 12, 14, and 16 in loop circuits of the type shown in FIG. 1. PFD 12 in FIG. 2 may be the same as PFD 12 in FIG. 1. VSS and VCC detection circuit 100 may be similar to circuit 100 in commonly assigned, concurrently filed U.S. patent application Ser. No. 08/668,265, which is hereby incorporated by reference herein. As described in that other specification, circuit 100 may swap the DWN and UP signals 13a and 13b in passing them on as DWNO and UPO signals 13a' and 13b' under certain conditions of the applied UF signal 17. Alternatively, circuit 100 may reset PFD 12 (via connection 147) under those conditions. For present purposes, however, circuit 100 can be substantially ignored and assumed to simply pass DWN through to DWNO and to pass UP through to UPO.

Before the phases and possibly also the frequencies of the reference clock signal 11 and the feed-back clock signal 21 match, if PFD 12 is producing DWN signal 13a (which calls for increasing the delay of variable delay circuit 18 (or decreasing the frequency of VCO 18)), and assuming that circuit 100 merely passes DWN through to DWNO, the DWNO signal will turn on transistor 212a in charge pump circuitry 14'. This connects the power voltage source VCC to low-pass filter 16 and causes the charge stored in the capacitor or charge storing component 234 of that filter to increase. The output voltage UF of filter 16 accordingly increases. The DWNO signal is prevented from also turning on transistor 226a because AND gates 224 are disabled by the output signal of lock detector 222 (described below). Similarly but conversely, before the phases and possibly also the frequencies of signals 11 and 21 are matched and locked, if PFD 12 is producing UP signal 13b (which calls for decreasing the delay of variable delay circuit 18 (or increasing the frequency of VCO 18)), and assuming that circuit 100 merely passes UP through to UPO, the UPO signal will turn on transistor 212b in charge pump circuitry 14'. This connects the ground voltage source VSS to low-pass filter 16 and causes the charge stored in the charge storing component 234 of that filter to decrease. The output voltage UF of filter 16 accordingly decreases. The UPO signal is prevented from also turning on transistor 226b because AND gates 224 are disabled as described above.

Digital phase detector 220 receives reference clock signal 11 and feed-back clock signal 21 and compares the phases of those two signals. If these two signal phases are approximately the same (e.g., within a predetermined relatively small time differential of one another), phase detector 220 produces an appropriate output signal 221. Signal 221 and the reference clock signal are applied to lock detector circuit 222. This circuit accumulates signal 221 for several successive reference clock cycles. This is a moving accumulation, with the oldest signal 221 value being discarded each time a new signal 221 value is received.

When lock detector circuit 222 detects that a sufficient number of the accumulated LOCK signal values represent substantial equality of the phases of signals 11 and 21, circuit 222 produces an output signal 223 which enables AND gates 224. This allows subsequently received DWNO or UPO signals to turn on transistor 226a or 226b, respectively, as well as continuing to turn on transistor 212a or 212b, respectively. The additional selective connection of low-pass filter 16 to VCC via transistor 226a (in parallel with the other similar selective connection via transistor 212a) increases the rate at which charge can be added to charge storing component 234 when called for by the DWNO signal during the phase locked condition of signals 11 and 21. Similarly but conversely, the additional selective connection of low-pass filter 16 to VSS via transistor 226b (in parallel with the other similar selective connection via transistor 212b) increases the rate at which charge can be withdrawn from charge storing component 234 when called for by the UPO signal during the phase locked condition of signals 11 and 21. This strengthening of charge pump 14' during a locked condition of the loop helps the loop remain locked, even in the presence of noise in the reference clock signal. If for any reason lock is lost for longer than a relatively small number of reference clock signal cycles, lock detector 222 switches its output signal 223 to the value which disables AND gates 224, and charge pump 14' returns to its initial, weaker mode of operation, using only transistors 212 to selectively charge or discharge capacitor 234. When lock is established again, lock detector 222 enables AND gates 224 again, and charge pump 14' then resumes its stronger mode of operation using transistors 212a and 226a to add charge to capacitor 234 or using transistors 212b and 226b to subtract charge from capacitor 234.

Figure 3:
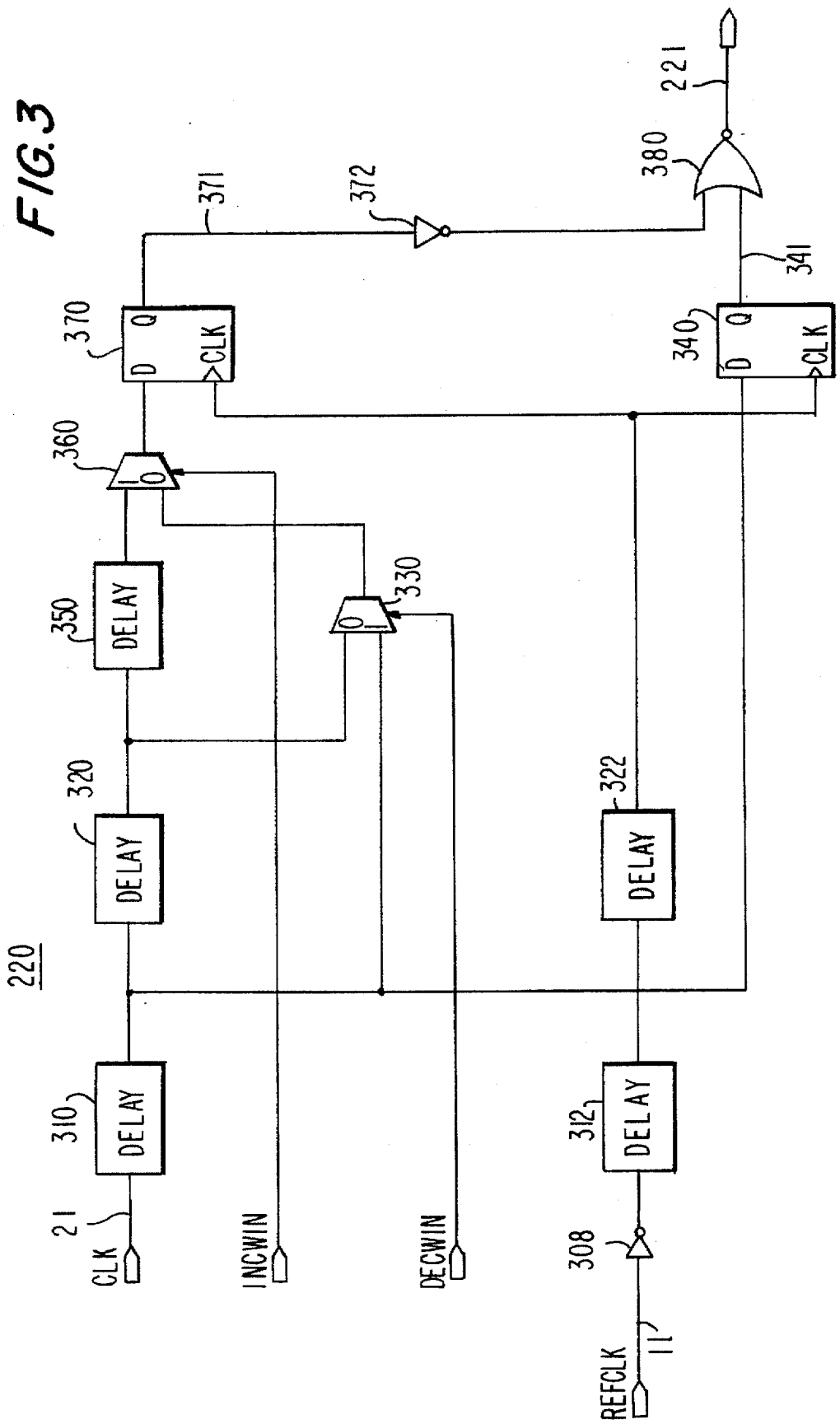
FIG. 3 is a more detailed, but still simplified, block diagram of an illustrative embodiment of a portion of the circuitry shown in FIG. 2 in accordance with this invention.

An illustrative embodiment of digital phase detector 220 is shown in FIG. 3. The feed-back clock signal 21 is applied to delay component 310. The output signal of delay component 310 is applied to (1) delay component 320, (2) the "1" input of multiplexer 330, and (3) the data input terminal of flip-flop 340. The output signal of delay component 320 is applied to (1) delay component 350, and (2) the "0" input of multiplexer 330. The output signal of delay component 350 is applied to the "1" input of multiplexer 360. The output of multiplexer 330 is applied to the "0" input of multiplexer 360. The output signal of multiplexer 360 is applied to the data input terminal of flip-flop 370.

The reference clock signal 11 is inverted by inverter 308, and the resulting inverted reference clock signal is applied to delay component 312. The output signal of delay component 312 is applied to delay component 322. The output signal of delay component 322 is applied to the clock input terminal of each of flip-flops 340 and 370. The Q output signal 341 of flip-flop 340 is applied to one input terminal of NOR gate 380. The Q output signal 371 of flip-flop 370 is inverted by inverter 372 and then applied to the other input terminal of NOR gate 380. The output signal of NOR gate 380 is signal 221.

Multiplexer 330 is controlled by a signal "DECWIN", which may be a programmable architecture bit of the IC that includes loop circuit 10. Multiplexer 360 is similarly controlled by another architecture bit "INCWIN" of the IC. The "normal" condition of the circuit is associated with DECWIN and INCWIN being 0. Then the feed-back clock signal 21 is applied to flip-flop 370 with a delay which is the sum of delays 310 and 320. If it is desired to decrease this normal delay, then DECWIN is set to 1, which causes delay 320 to be bypassed. If it is desired to increase the normal delay, then INCWIN is set to 1, which adds delay 350 to the amount by which the feed-back clock signal 21 is delayed to reach flip-flop 370. DECWIN and INCWIN may be used to compensate for process variations which affect the delay characteristics of the IC.

Assuming the use of delays 310 and 320, these delays and delays 312 and 322 are such that, when the phase of CLK is the same as or no more than a first predetermined relatively small amount ahead of the phase of REFCLK, then the data signal applied to flip-flop 370 will still be 1 when that flip-flop is clocked by the inverted and delayed REFCLK signal. On the other hand, if the phase of CLK is too far ahead of the phase of REFCLK, the data signal applied to flip-flop 370 will have dropped to 0 before that flip-flop is clocked by the inverted and delayed REFCLK signal. The Q output 371 of flip-flop 370 is of course the D input when the flip-flop was most recently clocked. The Q output of flip-flop 370 will therefore be 1 as long as the phase of CLK is no more than the above-mentioned first relatively small amount ahead of the phase of REFCLK.

Flip-flop 340 works similarly to flip-flop 370, except that the output signal of flip-flop 340 will be 0 unless the phase of CLK is no more than a second predetermined relatively small amount behind the phase of REFCLK. If the phase of CLK is too far behind REFCLK, the D input to flip-flop 340 will still be 1 when that flip-flop is clocked by the inverted and delayed REFCLK signal. But if the phase of CLK is not too far behind REFCLK, then the D input to flip-flop 340 will have fallen to 0 when the flip-flop is clocked.

From the foregoing it will be seen that the output signal of NOR gate 380 is 1 whenever the phase of CLK is relatively close to the phase of REFCLK (i.e., the phase of CLK is no more than the first relatively small amount ahead of and no more than the second relatively small amount behind the phase of REFCLK). Otherwise the output signal of NOR gate 380 is 0.

Figure 4:
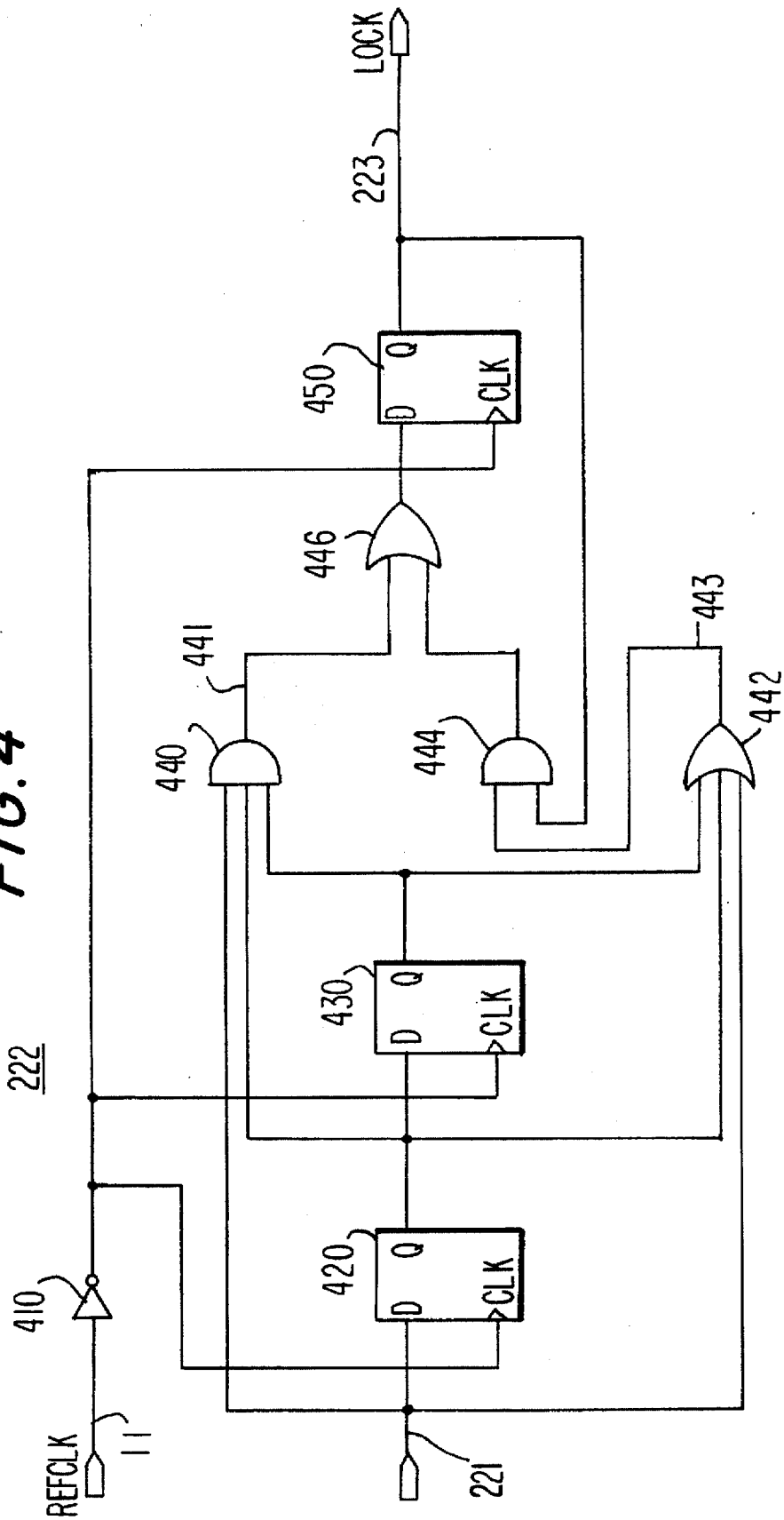
FIG. 4 is a more detailed, but still simplified, block diagram of an illustrative embodiment of another portion of the circuitry shown in FIG. 2 in accordance with this invention.

An illustrative embodiment of lock detector 222 is shown in FIG. 4. The reference clock signal 11 is inverted by inverter 410 and used to clock each of flip-flops 420, 430, and 450. The output signal 221 of digital phase detector 220 is applied to (1) the data input terminal of flip-flop 420, (2) one input terminal of AND gate 440, and (3) one input terminal of OR gate 442. The Q output signal of flip-flop 420 is applied to (1) the data input terminal of flip-flop 430, (2) a second input terminal of AND gate 440, and (3) a second input terminal of OR gate 442. The Q output signal of flip-flop 430 is applied to (1) a third input of AND gate 440 and (2) a third input of OR gate 442. The output signal 441 of AND gate 440 is applied to one input terminal of OR gate 446. The output signal 443 of OR gate 442 is applied to one input to AND gate 444. The other input to AND gate 444 is the Q output signal of flip-flop 450. The output signal of AND gate 444 is the second input to OR gate 446. The output signal of OR gate 446 is the data input to flip-flop 450. The Q output of flip-flop 450 is also the phase lock indicating output signal 223 ("LOCK") of the lock detector.

From the foregoing it will be seen that the output signal 441 of AND gate 440 will be 1 only if the output signal 221 of digital phase detector 220 has been 1 for the three most recent cycles of the REFCLK signal. The output signal 443 of OR gate 442 will be 1 only if the output signal 221 of digital phase detector 220 has been 1 in at least one of the three most recent cycles of the REFCLK signal. The value of LOCK signal 223 is given by the following table (where LOCK(t) is the current value of LOCK signal 223, and LOCK(t+1) is the value of LOCK signal 223 in the next REFCLK cycle):

TABLE A

| SIGNAL 441 | SIGNAL 443 | LOCK(t) | LOCK(t + 1) |
|---|---|---|---|
| 0 | 0 | 0 | 0 |
| 0 | 0 | 1 | 0 |
| 0 | 1 | 0 | 0 |
| 0 | 1 | 1 | 1 |
| 1 | 1 | 0 | 1 |
| 1 | 1 | 1 | 1 |

Table A shows that LOCK will remain 1 as long as at least one of the three most recent inputs 221 from digital phase detector 220 is 1. LOCK will switch from 0 to 1 after the input 221 has been 1 for three consecutive REFCLK signal cycles. Flip-flops 420 and 430 act like a shift register memory; flip-flop 450 acts like a latch; and gates 440, 442, 444, and 446 decode the outputs of the shift register and the latch to provide new input data for the latch during each REFCLK cycle.

It will be understood that the foregoing is only illustrative of the principles of the invention, and that various modifications can be made by those skilled in the art without departing from the scope and spirit of the invention. For example, a different number of successive digital phase detector 220 output signals 221 can be stored in flip-flops like 420 and 430 so that different criteria can be used for deciding when the phases of the CLK and REFCLK signals are locked.

Figure 5A:
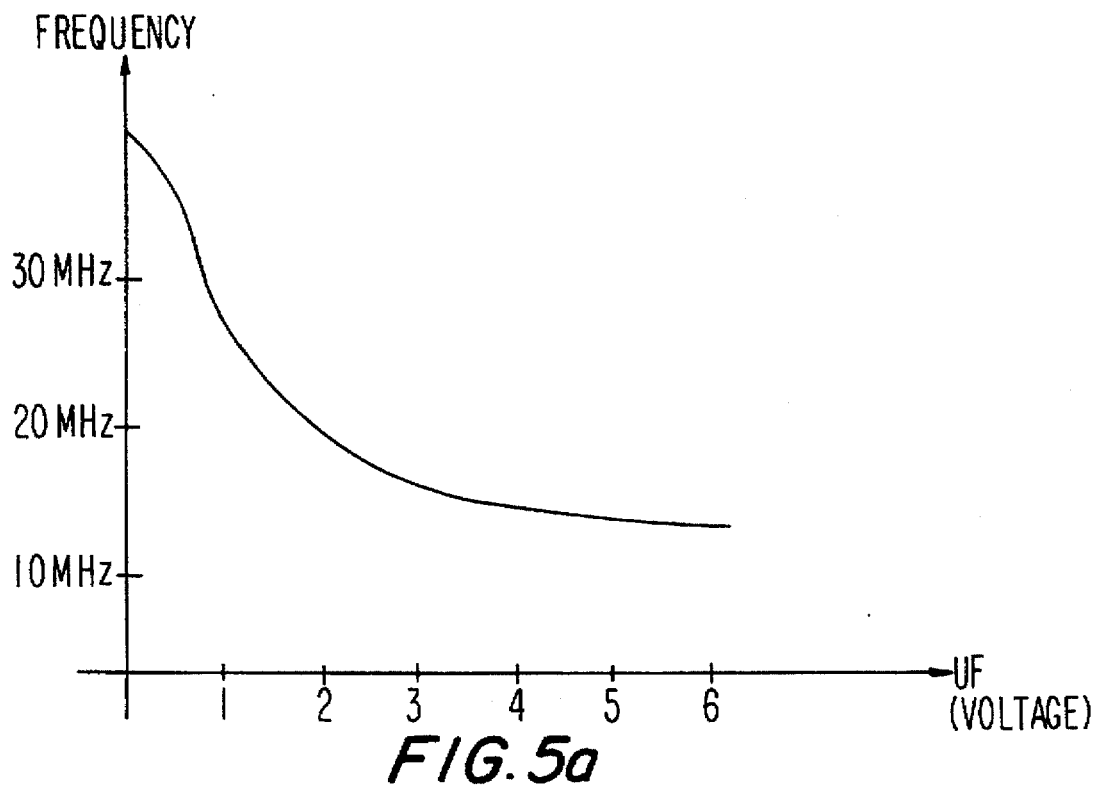
FIG. 5a is a graph of frequency response which is useful in explaining the possible operation of one component of the circuitry of this invention.
Figure 5B:
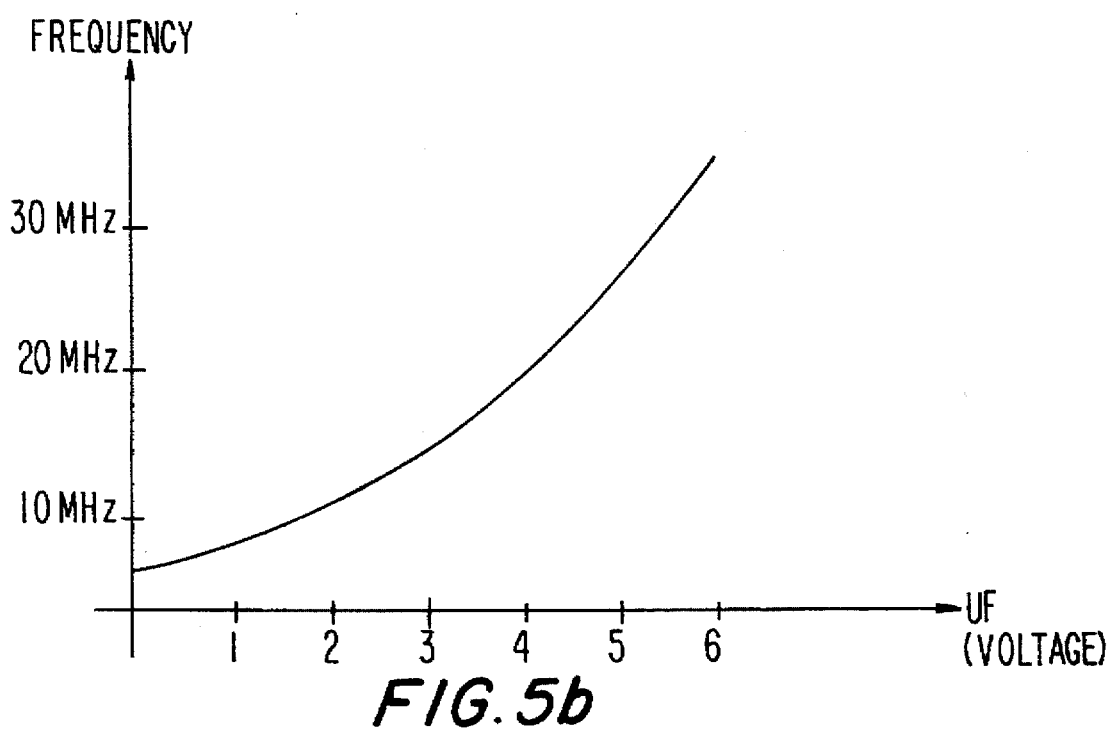

As another example of modifications within the scope of this invention, variable delay circuit or voltage controlled oscillater 18 can be constructed so that its delay or frequency increases or decreases with increasing low-pass filter 16 output. FIG. 5a, for example, shows the frequency response of one suitable type of VCO (i.e., a VCO whose output signal frequency decreases with increasing low-pass filter output voltage UF), while FIG. 5b shows the frequency response of another type of VCO (i.e., a VCO whose output signal frequency increases with increasing low-pass filter output voltage UF). It will be understood that either of these types of VCO can be used in the loop circuits of this inventions. All that is required to accommodate either of these types of VCO is to select the proper polarity for the connection of the DWN and UP signals in FIG. 2 to the transistors 212 and 226 in that FIG. The same is true for the use of variable delay circuitry 18 which either increases or decreases delay in response to increasing low-pass filter output.

The invention claimed is:

1. In a loop circuit which attempts to match the phase of a reference clock signal and the phase of a feed-back clock signal which is at least partly controlled by the loop circuit, the loop circuit including a phase frequency detector for comparing the phases of the reference and feed-back clock signals and for producing a first or second output depending on whether the phase of the reference clock signal is ahead of or behind the phase of the feed-back clock signal, a low-pass filter having a charge storing component for producing an output voltage indicative of how much charge is stored on said charge storing component, said output voltage at least partly controlling the phase of the feed-back clock signal, and a charge pump circuit responsive to said first and second outputs for applying charge to or withdrawing charge from said charge storing component depending on which of said first and second outputs is active, improved charge pump circuitry comprising:

phase lock detection circuitry for producing a phase lock output signal when the phase of the feed-back clock signal is approximately the same as the phase of the reference clock signal for at least a portion of a predetermined time interval; and charge pump amplifying circuitry responsive to said phase lock output signal for increasing the rate at which said charge pump circuit applies charge to or withdraws charge from said charge storing component in response to said first and second outputs.

2. The apparatus defined in claim 1 wherein said loop circuit further includes a power voltage source and a ground voltage source, wherein said charge pump circuit includes a first circuit responsive to said first output for selectively connecting said power voltage source to said charge storing component and a second circuit responsive to said second output for selectively connecting said charge storing component to said ground voltage source, and wherein said charge pump amplifying circuitry comprises:

a third circuit responsive to said first output and said phase lock output signal for selectively connecting said power voltage source to said charge storing component; and a fourth circuit responsive to said second output and said phase lock output signal for selectively connecting said charge storing component to said ground voltage source.

3. The apparatus defined in claim 2 wherein said first and third circuits are connected in parallel with one another between said power voltage source and said charge storing component, and wherein said second and fourth circuits are connected in parallel with one another between said charge storing component and said ground voltage source.

4. The apparatus defined in claim 1 wherein said phase lock detection circuitry comprises:

a phase detector circuit for producing a phase match output signal during each reference clock signal cycle in which the phase of the feed-back clock signal is approximately the same as the phase of the reference clock signal;

a shift register having a plurality of stages through which said phase match output signal is shifted at the rate of said reference clock signal; and combinatorial circuitry for producing said phase lock output signal when a sufficient number of said stages of said shift register contain said phase match signal produced during successive cycles of said reference clock signal.

5. The method of operating a loop circuit which attempts to match the phase of a reference clock signal and the phase of a feed-back clock signal which is at least partly controlled by the loop circuit, the loop circuit including a phase frequency detector for comparing the phases of the reference and feed-back clock signals and for producing a first or second output depending on whether the phase of the reference clock signal is ahead of or behind the phase of the feed-back clock signal, a low-pass filter having a charge storing component for producing an output voltage indicative of how much charge is stored on said charge storing component, said output voltage at least partly controlling the phase of the feed-back clock signal, and a charge pump circuit responsive to said first and second outputs for applying charge to or withdrawing charge from said charge storing component depending on whether said first or second output is active, said method comprising the steps of:

detecting when the phase of the feed-back clock signal is approximately the same as the phase of the reference clock signal for at least a portion of a predetermined time interval in order to then produce a phase lock output indication; and increasing the rate at which said charge pump circuit applies charge to or withdraws charge from said charge storing component in response to said first and second outputs after said phase lock output indication has been produced.

6. The method defined in claim 5 wherein said loop circuit further includes a power voltage source and a ground voltage source, wherein said charge pump circuit includes a first circuit responsive to said first output for selectively connecting said power voltage source to said charge storing component and a second circuit responsive to said second output for selectively connecting said charge storing component to said ground voltage source, and wherein said increasing step comprises the steps of:

selectively connecting a third circuit between said power voltage source and said charge storing component in response to said first output and said phase lock output indication; and selectively connecting a fourth circuit between said charge storing component and said ground voltage source in response to said second output and said phase lock output indication.

7. The method defined in claim 6 wherein said step of selectively connecting a third circuit connects said third circuit in parallel with said first circuit, and wherein said step of selectively connecting a fourth circuit connects said fourth circuit in parallel with said second circuit.

8. The method defined in claim 5 wherein said detecting step comprises the steps of:

comparing the phase of the feed-back clock signal and the phase of the reference clock signal during each cycle of the reference clock signal in order to produce a phase match output signal during each said cycle in which said phases are approximately the same;

storing the presence or absence of said phase match output signal for each of a predetermined number of successive cycles of said reference clock signal; and producing said phase lock output indication when, for a sufficient portion of said predetermined number of successive cycles, said phase match signal has been stored.

* * * * *